US009806120B2

(12) United States Patent
Sano et al.

(10) Patent No.: US 9,806,120 B2
(45) Date of Patent: Oct. 31, 2017

(54) SOLID-STATE IMAGE PICKUP APPARATUS AND ELECTRONIC APPARATUS

(71) Applicant: Sony Corporation, Tokyo (JP)

(72) Inventors: Takuya Sano, Kanagawa (JP); Toshifumi Wakano, Kanagawa (JP)

(73) Assignee: Sony Corporation, Tokyo (JP)

( * ) Notice: Subject to any disclaimer, the term of this patent is extended or adjusted under 35 U.S.C. 154(b) by 2 days.

(21) Appl. No.: 14/842,369

(22) Filed: Sep. 1, 2015

(65) Prior Publication Data

US 2015/0372043 A1   Dec. 24, 2015

Related U.S. Application Data

(63) Continuation of application No. 13/768,468, filed on Feb. 15, 2013.

(30) Foreign Application Priority Data

Mar. 8, 2012   (JP) .................. 2012-051427

(51) Int. Cl.
*H04N 5/378* (2011.01)
*H04N 5/374* (2011.01)
*H01L 27/146* (2006.01)

(52) U.S. Cl.
CPC .... *H01L 27/14634* (2013.01); *H01L 27/1464* (2013.01); *H01L 27/14621* (2013.01); *H01L 27/14623* (2013.01); *H01L 27/14636* (2013.01); *H01L 27/14641* (2013.01); *H04N 5/374* (2013.01); *H04N 5/378* (2013.01)

(58) Field of Classification Search
CPC ...... H04N 5/374; H04N 5/3745; H04N 5/357; H04N 5/359
USPC .............................................. 348/308, 222.1
See application file for complete search history.

(56) References Cited

U.S. PATENT DOCUMENTS

| 8,098,312 B2* | 1/2012 | Matsuo | H01L 27/14636 348/294 |
| 2010/0225776 A1 | 9/2010 | Taura | |
| 2011/0233702 A1* | 9/2011 | Takahashi | H01L 21/76898 257/432 |

FOREIGN PATENT DOCUMENTS

| JP | 2003-031785 A | 1/2003 |
| JP | 2007-115994 | 5/2007 |
| JP | 2008-294218 | 12/2008 |
| JP | 2009-135319 | 6/2009 |

\* cited by examiner

*Primary Examiner* — Padma Haliyur
(74) *Attorney, Agent, or Firm* — Michael Best & Friedrich LLP

(57) ABSTRACT

A solid-state image pickup apparatus includes a pixel region in which a plurality of pixels each including a photoelectric conversion element are arranged, transfer wirings formed on the pixel region in parallel to each other with uniform opening widths, and different wirings formed in a wiring layer above the transfer wirings. At least a part of the different wirings is overlapped with the transfer wirings on a plan position. The transfer wirings and the different wirings form a light shielding structure in the pixel region.

28 Claims, 10 Drawing Sheets

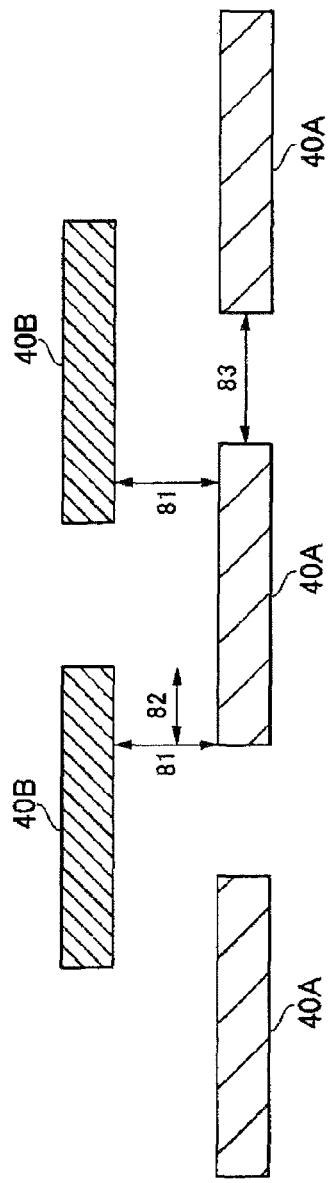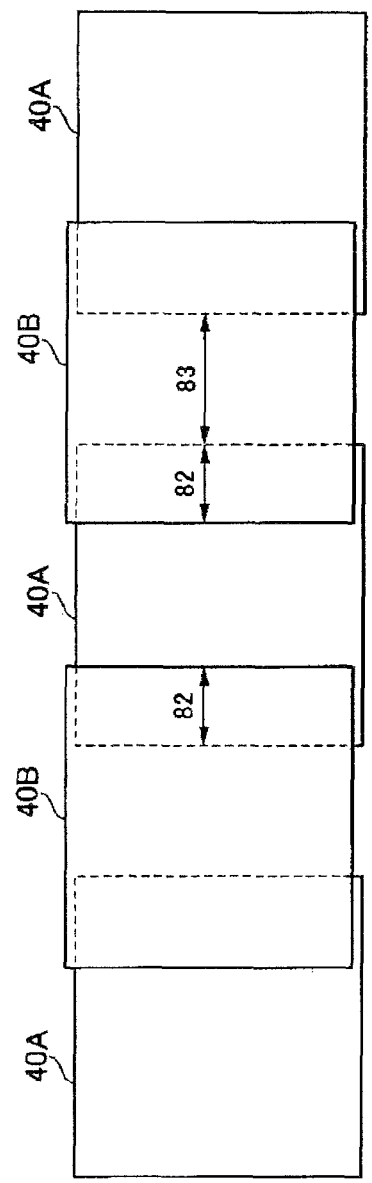
FIG.4A
FIG.4B

SOLID-STATE IMAGE PICKUP APPARATUS AND ELECTRONIC APPARATUS

CROSS REFERENCE TO RELATED APPLICATIONS

The present application is a Continuation of U.S. application Ser. No. 13/768,468, filed Feb. 15, 2013, which claims the benefit of Japanese Priority Patent Application JP 2012-051427 filed Mar. 8, 2012, the entire contents of which are incorporated herein by reference.

BACKGROUND

The present disclosure relates to a solid-state image pickup apparatus and an electronic apparatus.

A CMOS (complementary metal oxide semiconductor) solid-state image pickup apparatus known as a solid-state image pickup apparatus involves a low power source voltage and low power consumption. Therefore, the CMOS solid-state image pickup apparatus is used for a digital still camera, a digital video camera, and various mobile terminal apparatuses such as a camera-equipped cellular phone, for example.

The CMOS solid-state image pickup apparatus is provided with pixels constituted of photodiodes serving as photoelectric conversion units and a plurality of pixel transistors. Further, the CMOS solid-state image pickup apparatus includes a pixel unit in which a plurality of pixels are arranged in a two-dimensional array form and a peripheral circuit unit disposed on the periphery of the pixel unit.

Further, these days, attention is being focused on a back surface irradiation type CMOS solid-state image pickup apparatus (see, Japanese Patent Application Laid-open Nos. 2007-115994 and 2003-31785). The back surface irradiation type CMOS solid-state image pickup apparatus has a light incident surface on an opposite side (back surface of substrate) to a side on which a wiring is provided (front surface of substrate). Therefore, it is possible to provide the wiring of a pixel unit on a photodiode, with the result that the degree of freedom of a layout is dramatically increased.

Furthermore, along with achieving of a finer pixel size, a CMOS solid-state image pickup apparatus of a pixel sharing type in which a plurality of photodiodes are caused to share a pixel transistor group excluding a transfer transistor is also known (see, Japanese Patent Application Laid-open Nos. 2008-294218 and 2009-135319).

SUMMARY

In the back surface irradiation type CMOS solid-state image pickup apparatus described above, when an interval between adjacent wirings becomes smaller as the pixel size becomes finer, capacitive coupling between the wirings does not become negligible. In a transfer wiring, a pulse voltage supplied to a transfer gate varies due to an influence of another wiring. In particular, if an off-state voltage that is supplied to the transfer gate varies, a potential in a substrate under the transfer gate varies. The potential variation causes charges accumulated in the photodiodes to leak into a floating diffusion (FD), which causes problems of a change in saturation signal amount (Qs), an increase in variation of the saturation signal amount between the photodiodes, and the like. In this way, if the variation in the saturation signal amount is large for each pixel, the image quality of the solid-state image pickup apparatus degrades.

In view of the above-mentioned circumstances, it is desirable to provide a solid-state image pickup apparatus and an electronic apparatus having such a structure that the quality of images can be upgraded.

According to an embodiment of the present disclosure, there is provided a solid-state image pickup apparatus including a pixel region in which a plurality of pixels each including a photoelectric conversion element are arranged, transfer wirings formed on the pixel region in parallel to each other with uniform opening widths, and different wirings formed in a wiring layer above the transfer wirings. At least a part of the different wirings is overlapped with the transfer wirings on a plan position, and the transfer wirings and the different wirings form a light shielding structure in the pixel region.

According to another embodiment of the present disclosure, there is provided an electronic apparatus including the solid-state image pickup apparatus and a signal processing circuit configured to process an output signal of the solid-state image pickup apparatus.

With the solid-state image pickup apparatus described above, the transfer wirings are arranged in parallel to each other with uniform opening widths. Therefore, the coupling capacitance between the transfer wirings becomes constant, and a variation of a saturation signal amount between pixels becomes constant. Thus, the saturation signal amount between the pixels is equalized, with the result that the image quality of the solid-state image pickup apparatus can be upgraded.

Further, with the use of the solid-state image pickup apparatus, it is possible to upgrade the image quality of the electronic apparatus.

According to the present disclosure, it is possible to provide the solid-state image pickup apparatus and the electronic apparatus that can upgrade the image quality.

These and other objects, features and advantages of the present disclosure will become more apparent in light of the following detailed description of best mode embodiments thereof, as illustrated in the accompanying drawings.

BRIEF DESCRIPTION OF DRAWINGS

FIGS. 4A and 4B are a cross-sectional structure and a plan structure of wiring layers, respectively;

DETAILED DESCRIPTION OF EMBODIMENTS

Figure 1:
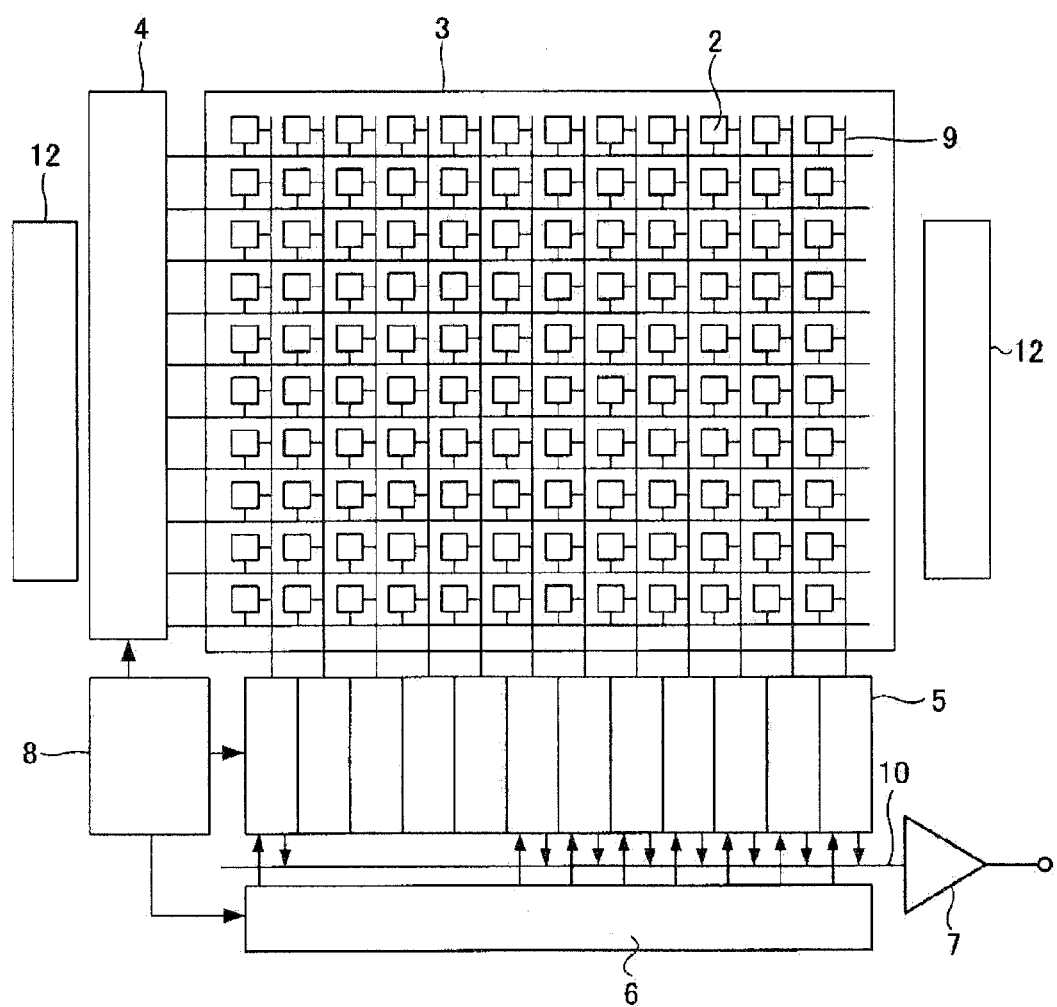
FIG. 1 is a plan view showing the structure of a solid-state image pickup apparatus according to a first embodiment of the present disclosure.

Hereinafter, an embodiment of the present disclosure will be described with reference to the drawings.

It should be noted that the description will be given in the following order.

1. Outline of solid-state image pickup apparatus
2. First embodiment of solid-state image pickup apparatus
3. Second embodiment of solid-state image pickup apparatus
4. Third embodiment of solid-state image pickup apparatus
5. Fourth embodiment of solid-state image pickup apparatus
6. Electronic apparatus 1. Outline of Solid-State Image Pickup Apparatus Hereinafter, the outline of a solid-state image pickup apparatus will be described.

In general, in a back surface irradiation type CMOS solid-state image pickup apparatus, a horizontal overflow structure is formed as a countermeasure against blooming. In the horizontal overflow structure, charges are caused to escape from below a transfer gate through a floating diffusion. Therefore, in the back surface irradiation type CMOS solid-state image pickup apparatus, due to an influence of the horizontal overflow structure, the potential at the transfer gate is likely to vary. In this way, in a transfer wiring that supplies a pulse voltage to the transfer gate, due to the influence of capacitive coupling between wirings, the change in saturation signal amount (Qs) or an increase in variation in the saturation signal amount between the photodiodes may be caused, for example.

To suppress the variation in the saturation signal amount, it is necessary to uniform the potential variation of the transfer gate. If the potential variation of the transfer gate is uniform, the variation in the potential in a substrate under the transfer gate is equalized, with the result that the variation in the saturation signal amount is eliminated.

To make the potential variation of the transfer gate uniform, a response in a viewpoint of a wiring arrangement in a pixel unit is necessary. In view of this, by devising the wiring arrangement in the pixel unit, the coupling capacitance of the transfer wiring and another wiring is equalized. Thus, if the coupling capacitance can be equalized, the potential variation of the transfer wiring is equalized in each transfer gate. Therefore, it is possible to suppress the variation in the saturation signal amount.

On the other hand, in the solid-state image pickup apparatus, as a method for downsizing a plurality of chips and a plurality of functions, such an effort that the plurality of chips are bonded to each other to make a high-speed transfer possible is started. In this case, a photoelectric conversion element unit and a peripheral circuit unit are formed so as to be very close to each other, so a problem inherent in an image sensor is caused. A photoelectric conversion element uses fine carriers (electrons) as signals, so an influence of heat or an electromagnetic field from a circuit therearound tends to be mixed therein as a noise. In addition, minute hot carrier light emission, which is negligible in a normal circuit operation of a transistor or a diode, significantly affects the characteristics of the image sensor.

The hot carrier light emission is caused by generating and recoupling holes and electrons that are generated at a time when carriers accelerated between a source and a drain are subjected to collisional ionization at a drain corner or by causing a state transition of either one. The light is generated minutely but steadily even in a transistor having no problem in characteristics. The light is diffused in all directions, so an influence thereof becomes smaller at a distance. However, in the case where the photoelectric conversion element and a circuit are disposed very closely, the light is not diffused very much, and photons are considerably implanted into the photoelectric conversion element.

In this way, the diffusion of the hot carrier light is insufficient, so a generation distribution of the hot carrier light due to a difference in an active rate or a transistor disposition density of the circuit gets in an image as two-dimensional information. To deal with this, it is necessary to provide a light shielding structure for keeping the amount of implantation in the photoelectric conversion element below a detection limit.

In related art, to suppress the variation in the saturation signal amount, by devising the arrangement of the wirings in the pixel unit, the coupling capacitance of the transfer wiring and another wiring is equalized.

In the case where the wiring arrangement in related art is used, however, one or more gaps are generated between adjacent wirings, and therefore it is necessary to additionally prepare a light shielding structure to suppress the influence of the hot carrier light emission as described above.

In the case where the light shielding structure is formed by additionally providing a light shielding film, the light shielding film is made of a material such as W, Cu, Ti, TiN, and C. An absorption film may be formed by using a material that absorbs light instead of the light shielding film. However, both of the cases have demerits in terms of the cost and the like.

In view of this, in this embodiment, a wiring structure is provided which is capable of achieving the equalization of the coupling capacitance and the light shielding structure without additionally providing a new structure for light shielding.

2. First Embodiment of Solid-State Image Pickup Apparatus

Schematic Structure of Solid-State Image Pickup Apparatus

FIG. 1 is the schematic structure of a MOS solid-state image pickup apparatus which is applied to a solid-state image pickup apparatus of this embodiment. The MOS solid-state image pickup apparatus is applied to a solid-state image pickup apparatus of each embodiment. A solid-state image pickup apparatus 1 in this embodiment includes a semiconductor substrate (not shown), a pixel region (so-called pixel array) 3 in which pixels 2 including a plurality of photoelectric conversion units are arranged in a regular two-dimensional array pattern on the semiconductor substrate (not shown), for example, on a silicon substrate, and a peripheral circuit unit. The pixel 2 includes a photodiode serving as the photoelectric conversion unit and a plurality of pixel transistors (so-called MOS transistors), for example. The plurality of pixel transistors can be constituted of three transistors of a transfer transistor, a reset transistor, and an amplification transistor, for example. Further, a selection transistor can be added thereto, and thus the four transistors can constitute the pixel transistors. An equivalent circuit of a unit pixel is the same as a normal case, so a detailed description thereof will be omitted. The pixel 2 can be formed as one unit pixel. Further, the pixel 2 can also be a pixel sharing structure. The pixel sharing structure is the structure in which the plurality of photodiodes share transistors excluding the transfer transistor and the floating diffusion that forms the transfer transistor.

The peripheral circuit unit includes a vertical drive circuit 4, column signal processing circuits 5, a horizontal drive circuit 6, an output circuit 7, a control circuit 8, and the like.

The control circuit 8 receives data for giving an instruction of an operation mode or the like and an input clock and outputs data such as internal information of the solid-state image pickup apparatus. That is, in the control circuit 8, on the basis of a vertical synchronization signal, a horizontal synchronization signal, and a master clock, a clock signal and a control signal as a reference of an operation of the vertical drive circuit 4, the column signal processing circuits 5, and the horizontal drive circuit 6, and the like is generated. The signals are input to the vertical drive circuit 4, the column signal processing circuits 5, and the horizontal drive circuit 6, and the like.

The vertical drive circuit 4 is formed of a shift register, for example, and selects a pixel drive wiring, supplies pulses for driving pixels to the pixel drive wiring selected, and drives pixels in the unit of a row. In other words, the vertical drive circuit 4 performs selection scanning for the pixels 2 in the pixel area 3 in the unit of a row sequentially in a vertical direction, and supplies, to the column signal processing circuit 5, a pixel signal based on a signal charge generated in accordance with a reception light quantity in the photodiode or the like as the photoelectric conversion unit of the pixels 2 through a vertical signal line 9.

The column signal processing circuit 5 is provided for each of columns or the like of the pixels 2 and performs signal processing of a noise removal or the like for each pixel column with respect to a signal output from the pixels 2 of one column. That is, the column signal processing circuit 5 performs signal processing such as a CDS for removing a fixed pattern noise inherent in the pixels 2, signal amplification, and an AD conversion. On an output stage of the column signal processing circuit 5, a horizontal selection switch (not shown) is connected with a horizontal signal line 10.

The horizontal drive circuit 6 is formed of a shift register or the like, sequentially outputs horizontal scanning pulses, thereby selecting the column signal processing circuits 5 in order, and causes each of the column signal processing circuits 5 to output a pixel signal to the horizontal signal line 10.

The output circuit 7 performs signal processing for signals sequentially supplied from the column signal processing circuits 5 through the horizontal signal line 10 and outputs the signals. For example, only buffering may be performed, or a black level adjustment, a column variation correction, various digital signal processing, and the like may be performed. An input and output terminal 12 is used to transmit and receive signals to and from outside.

Next, the structure of the MOS solid-state image pickup apparatus according to this embodiment will be described.

Figure 2A:
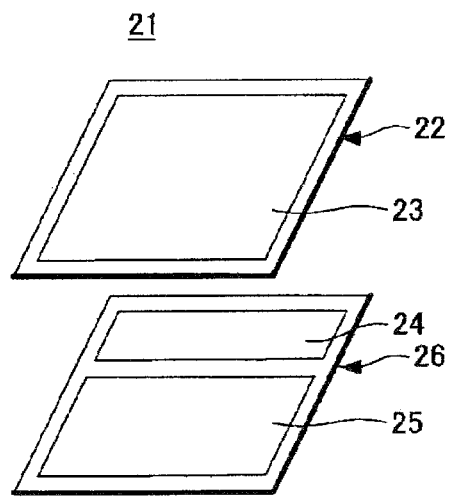
FIGS. 2A and 2B are schematic diagrams each showing the structure of the solid-state image pickup apparatus.
Figure 2B:
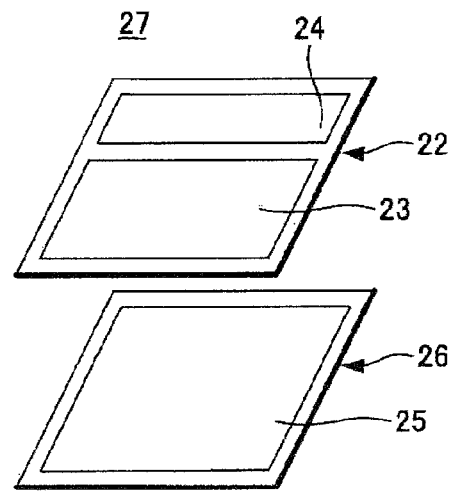

FIGS. 2A and 2B are schematic structural diagrams each showing the structure of the MOS solid-state image pickup apparatus according to this embodiment.

As shown in FIG. 2A, in a MOS solid-state image pickup apparatus 21 in this example, a pixel region 23 is mounted on a first semiconductor chip unit 22, and a control circuit 24 and a logic circuit 25 including a signal processing circuit are mounted on a semiconductor chip unit 26. The first semiconductor chip unit 22 and the second semiconductor chip unit 26 are electrically connected with each other, thereby forming the MOS solid-state image pickup apparatus 21 as one semiconductor chip.

As shown in FIG. 2B, in a MOS solid-state image pickup apparatus 27 in an example, the pixel region 23 and the control circuit 24 are mounted on the first semiconductor chip unit 22, and the logic circuit 25 including the signal processing circuit for performing signal processing is mounted on the second semiconductor chip unit 26. The first semiconductor chip unit 21 and the second semiconductor chip unit 26 are electrically connected with each other, thereby forming the MOS solid-state image pickup apparatus 27 as one semiconductor chip.

Although not shown, in a MOS solid-state image pickup apparatus in another example, on the first semiconductor chip unit 22, the pixel region 23 and a control circuit unit which is suitable for control of the pixel region as a part of the control circuit are mounted. Further, on the second semiconductor chip unit 26, the logic circuit 25 and a control circuit unit which is suitable for control of the logic circuit as another part of the control circuit are mounted. The first semiconductor chip unit 22 and the second semiconductor chip unit 26 are electrically connected with each other, thereby forming the MOS solid-state image pickup apparatus 27 as one semiconductor chip.

The MOS solid-state image pickup apparatus in the above example has the structure in which semiconductor chips of different kinds are layered and has a characteristic thereof in the structure to be described later.

(Cross-Sectional Structure of Solid-State Image Pickup Apparatus)

Figure 3:
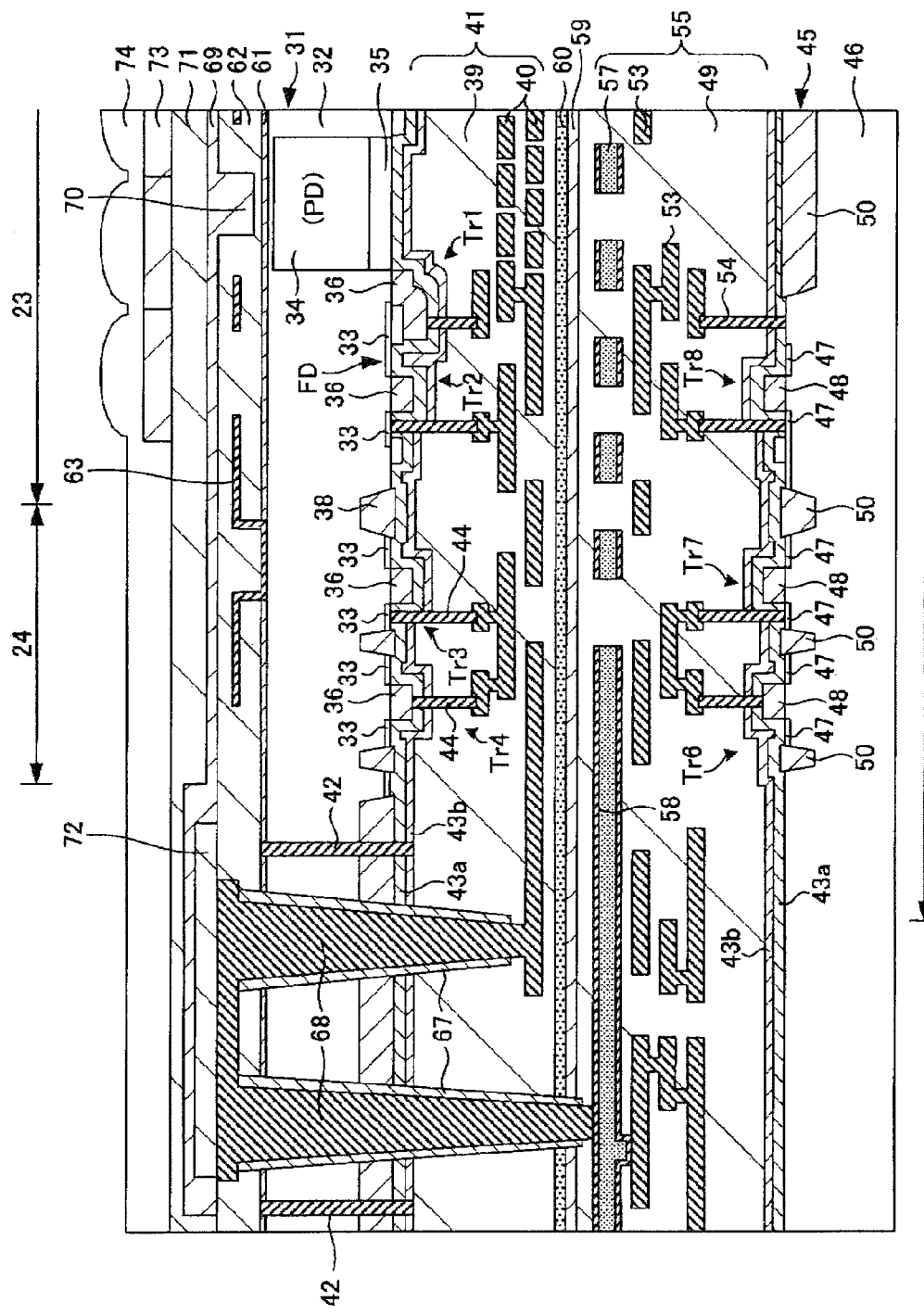
FIG. 3 is a cross-sectional view showing the structure of the solid-state image pickup apparatus according to the first embodiment.

FIG. 3 shows the solid-state image pickup apparatus, in particular, the MOS solid-state image pickup apparatus according to the first embodiment. The MOS solid-state image pickup apparatus according to this embodiment is a back surface irradiation type solid-state image pickup apparatus. To the MOS solid-state image pickup apparatus according to this embodiment, the structure shown in FIG. 2B is applied, but the structure shown in FIG. 2A or the structure in which the control circuit is mounted separately on the first and second semiconductor chip units can also be applied. In a second embodiment and embodiments subsequent thereto, the structures can be applied in the same way.

The solid-state image pickup apparatus according to the first embodiment is formed by bonding a first semiconductor chip unit 31 and a second semiconductor chip unit 45 to each other. On the first semiconductor chip unit 31, a pixel array (hereinafter, referred to as pixel region 23) in which a photodiode PD serving as a photoelectric conversion unit and pixels constituted of a plurality of pixel transistors are two-dimensionally arranged and a control circuit 24 are formed.

The photodiode PD has an n-type semiconductor region 34 in a semiconductor well region 32 and a p-type semiconductor region 35 on the surface side of a substrate. On the surface of the substrate that forms the pixels, a gate electrode 36 is formed through a gate insulating film, and a source and drain region 33 that forms a pair with the gate electrode 36 forms pixel transistors Tr1 and Tr2. In FIG. 3, the two pixel transistors Tr1 and Tr2 are shown so as to be representative of the plurality of pixel transistors. The pixel transistor Tr1 adjacent to the photodiode PD corresponds to the transfer transistor, and the source and drain region thereof corresponds to the floating diffusion FD. Unit pixels are isolated by an element isolation region 38.

On the other hand, the control circuit 24 is constituted of a plurality of MOS transistors formed in the semiconductor well region 32. In FIG. 3, the plurality of MOS transistors that constitute the control circuit 24 are represented by MOS transistors Tr3 and Tr4. The MOS transistors Tr3 and Tr4 are each formed by n-type source and drain region 33 and the gate electrode 36 formed through the gate insulating film.

On the side of the front surface of the substrate, a multilayer wiring layer 41 formed by arranging wirings 40 for a plurality of layers through an interlayer insulating film 39. The wiring 40 is formed of a copper wiring, for example. The pixel transistor and the MOS transistor of the control circuit are connected to a necessary wiring 40 through a connected conductor 44 that penetrates a first insulating film 43a and a second insulating film 43b. The first insulating film 43a is formed of a silicon oxide film, for example, and the second insulating film 43b is formed of a silicon nitride film, for example, that serves as an etching stopper.

On the back surface of the semiconductor well region 32, an antireflection film 61 is formed. On a region on the antireflection film 61 which corresponds to each of the photodiodes PD, a waveguide 70 formed of a waveguide material film (for example, SiN film) 69 is formed. In an insulating film 62 formed of a SiO film or the like on the back surface of the semiconductor well region 32, a light shielding film 63 that shields light with respect to a necessary area. Further, a color filter 73 and an on-chip micro lens 74 are formed through a flattening film 71 so as to correspond to each of the photodiodes PD.

On the other hand, on the semiconductor chip unit 45, a logic circuit 25 including a signal processing circuit for performing signal processing is formed. The logic circuit 25 is formed by forming a plurality of MOS transistors in, for example, a p-type semiconductor well region 46 so as to be isolated by an element isolation region 50. In this case, the plurality of MOS transistors are represented by MOS transistors Tr6, Tr7, and Tr8. The MOS transistors Tr6, Tr7, and Tr8 each have a pair of n-type source and drain region 47 and a gate electrode 48 formed through the gate insulating film.

On the semiconductor well region 46, a multilayer wiring layer 55 is formed in which a wiring 53 in a plurality of layers and a wiring 57 having a barrier metal layer 58 are disposed through an interlayer insulating film 49. The MOS transistors Tr6, Tr7, and Tr8 are each connected to the necessary wiring 53 through a connected conductor 54 that penetrates the first insulating film 43a and the second insulating film 43b.

The first semiconductor chip unit 31 and the second semiconductor chip unit 45 are bonded to each other with an adhesive layer 60 or the like so that the multilayer wiring layers 41 and 55 thereof face each other. On a bonded surface of the multilayer wiring layer 55 on the side of the second semiconductor chip unit 45, a stress correction film 59 for reducing a bonding stress is formed. The bonding can also be performed by plasma bonding.

Further, the first semiconductor chip unit 31 and the second semiconductor chip unit 45 are electrically connected through a connected conductor 68. That is, a connection hole is formed which penetrates the semiconductor well region 32 of the first semiconductor chip unit 31 and reaches the necessary wiring 40 of the multilayer wiring layer 41. Further, a connection hole is formed which penetrates the semiconductor well region 32 of the first semiconductor chip unit 31 and the multilayer wiring layer 41 and reaches the necessary wiring 53 of the multilayer wiring layer 55. The connected conductor 68 that are connected to those connection holes are buried, thereby electrically connecting the first semiconductor chip unit 31 and the second semiconductor chip unit 45. An insulating film 67 surrounds the connected conductor 68 therearound so that the connected conductor 68 is insulated from the semiconductor well region 32. The wirings 40 and 57 that are connected to the connected conductor 68 correspond to vertical signal lines. The connected conductor 68 is connected to an electrode pad (not shown) or may be set as an electrode pad.

The connected conductor 68 is formed after the semiconductor chip unit 31 and the second semiconductor chip unit 45 are bonded to each other, and then the semiconductor well region 32 of the first semiconductor chip unit 31 is thinned. After that, a cap film 72, the flattening film 71, the color filter 73, and the on-chip micro lens 74 are formed. In the semiconductor well region 32, an insulating spacer layer 42 is formed around the connected conductor 68.

In this embodiment, a light shielding structure is formed by wiring in an area that covers the pixel region with no space and is between the photodiode PD of the pixel region 23 and the logic circuit 25.

For example, in the solid-state image pickup apparatus, in the multilayer wiring layer 41 of the photoelectric conversion element of the pixel region, the wiring 40 is disposed so as to cover the pixel region with no space. At this time, by using two or more wiring layers, the wirings 40 are overlapped with each other to some extent, with the result that it is possible to prevent a light diffraction influence and suppress incident light from a lower portion.

Further, to equalize the coupling capacitance, in the light shielding structure, transfer wirings disposed at equal intervals in the same layer and other wirings disposed in a different layer so as to be overlapped with the transfer wirings to a certain degree are combined. With this structure, it is possible to form the light shielding structure that shields light radiated at the time of an operation of an active element of the peripheral circuit unit only by the wiring layers without additionally providing a layer for light shielding. With this structure, it is possible to prevent the hot carrier light from entering the photodiode PD of the pixel. As the active element, a MOS transistor, a protection diode, or the like is used.

(Light Shielding Structure by Wiring)

FIGS. 4A and 4B each show a structural example of the light shielding structure by the wiring. FIG. 4A is a diagram showing a cross-sectional view of the wiring layer, and FIG. 4B is a diagram showing a plan view of the wiring layer.

At least two layers of a wiring 40A and a wiring 40B constitute the light shielding structure.

In the light shielding structure, a lamination interval between the wiring 40A on a lower layer and the wiring 40B on an upper layer is set as a distance 81. In the same way, a length by which the wiring 40A on the lower layer and the wiring 40B on the upper layer are overlapped with each other in a plane direction is set as an overlap amount 82. An interval between the wirings 40A on the lower layer is set as an opening width 83.

The overlap amount 82 is defined by the distance 81 and the opening width 83 between the wirings. The hot carrier light is generated as a point light source, so it is necessary to shield light that is incident obliquely. The overlap amount 82 is set to be larger than at least the distance 81 between the wirings, with the result that the light shielding performance for the hot carrier light in an oblique direction is increased.

Further, the opening widths 83 of the wirings between the wirings 40A formed in the same layer are set to be equal. Furthermore, the overlap amounts 82 are uniformly formed. With this structure, the positional relationship between the wirings 40A and 40B can be equalized, and therefore the coupling capacitance can be equalized.

(Pixel Sharing Unit: Pixel Structure)

Figure 5:
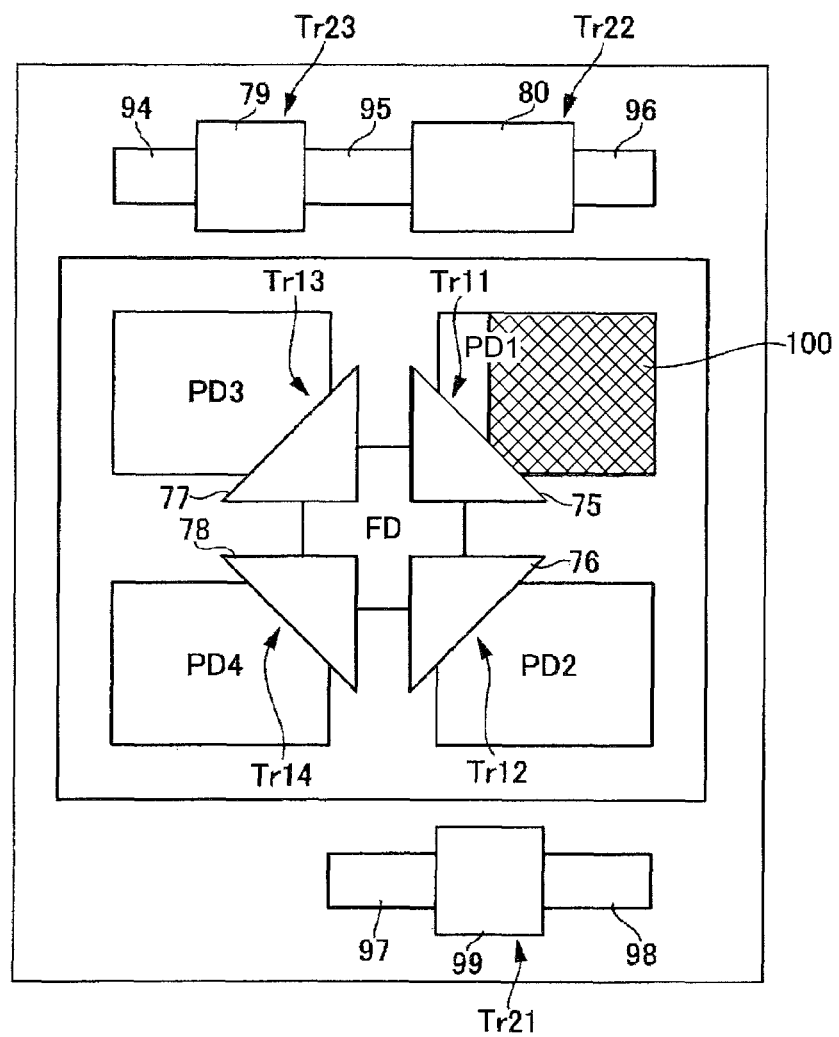
FIG. 5 is a diagram showing the structure of a pixel structure of a 4 pixel sharing unit.

Next, a description will be given on the structure of a pixel unit that is applied to the solid-state image pickup apparatus according to this embodiment. FIG. 5 shows the structure of the pixel unit formed of a 4 pixel sharing unit, which is applied to this embodiment. As shown in FIG. 5, the 4 pixel sharing unit in which the photodiodes PD (PD1 to PD4) of four pixels are arranged is disposed in a two-dimensional array form, thereby forming the pixel unit.

The 4 pixel sharing unit has the structure in which one floating diffusion FD is shared by the four photodiodes PD (two in a horizontal direction and two in a vertical direction). The unit includes four photodiodes PD1 to PD4, transfer gate electrodes 75 to 78 for the photodiodes PD1 to PD4, respectively, and the one floating diffusion FD. The photodiodes PD1 to PD4, the floating diffusion FD, and the transfer gate electrodes 75 to 78 constitute transfer transistors Tr11 to Tr14, respectively. The floating diffusion FD is disposed on a center portion surrounded by the four photodiodes PD1 to PD4, and the transfer gate electrodes 75 to 78 are disposed on positions corresponding to corner portions of the photodiodes PD1 to PD4 on the side of the center portion, respectively.

In addition, in FIG. 5, above the 4 pixel sharing unit, a selection transistor Tr23 and an amplification transistor Tr22 are disposed. Below the 4 pixel sharing unit, a reset transistor Tr21 is disposed. The selection transistor Tr23 includes a pair of source and drain regions 94 and 95 and a selection gate electrode 79. The amplification transistor Tr22 includes a pair of source and drain regions 95 and 96 and an amplification gate electrode 80. The reset transistor includes a pair of source and drain regions 97 and 98 and a reset gate electrode 99. The gate electrodes are each formed of a polysilicon film. The FD1 is connected to the amplification gate electrode 80 of the amplification transistor Tr23 and the source region of the reset transistor Tr21.

In the wiring layer of a region in which the photodiodes PD are formed, the light shielding structure described above is formed. It is desirable that the light shielding region by the wiring layer entirely covers the region in which the photodiodes PD are formed.

However, if the region in which the photodiodes PD are formed is not entirely covered, it is possible to obtain the effect of the light shielding structure. For example, like a light shielding region 100 shown in FIG. 5, it is desirable to perform light shielding for a square region including at least a short side of the photodiode PD1 as one side. In the same way, for each of the photodiodes PD2 to PD4, a square region including a short side of each of the photodiodes PD2 to PD4 as one side is subjected to the light shielding. By forming the light shielding structure is formed by wiring on the light shielding region 100, it is possible to obtain a sufficient light shielding effect. In this way, in the case where the light shielding layer that partially covers the region of the photodiode PD is provided without entirely covering the region in which the photodiode PD is formed, it is also possible to obtain the effect of the light shielding structure.

(Structure of Wiring: Structural Example of Light Shielding Structure)

Next, a description will be given on the light shielding structure by the wiring layer, which is provided on the pixel unit in which the 4 pixel sharing unit is formed described above.

As shown in FIG. 3, in the back surface irradiation type CMOS solid-state image pickup apparatus, on the front surface side of the semiconductor substrate, a pixel transistor is formed, and the wiring layer in which wirings of the plurality of layers formed of metal layers are disposed through the interlayer insulating film is formed thereabove. On the back surface side of the semiconductor substrate, the color filter layer and the on-chip lens are formed, and light enters the back surface of the substrate. That is, the back surface irradiation type has the structure in which the wiring layers are formed on the opposite side to the light incident surface.

Figures 6A, 6B:
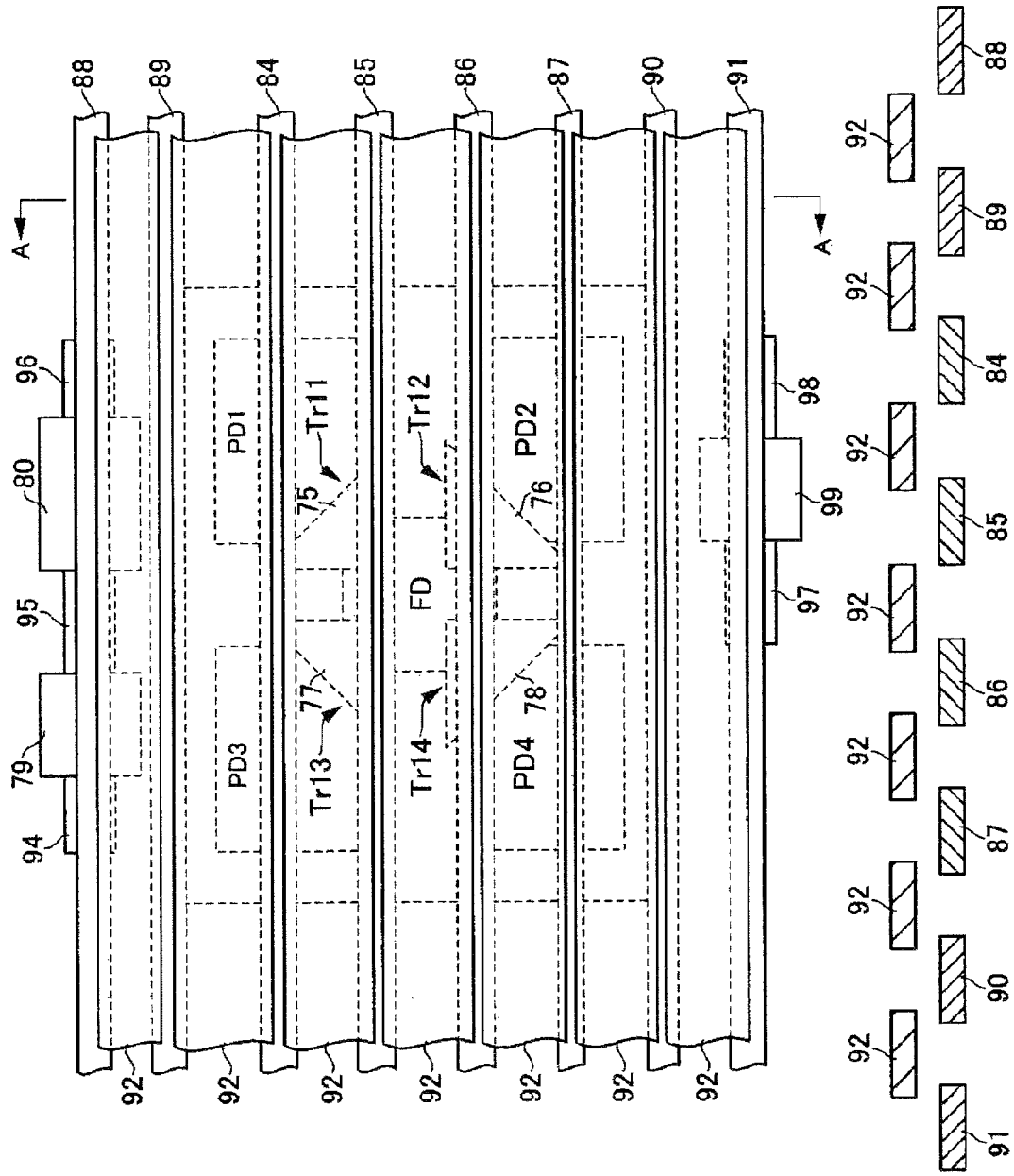
FIG. 6A is a plan view showing the structure of a light shielding structure of the solid-state image pickup apparatus according to the first embodiment.
FIG. 6B is a cross-sectional view of wiring layers that constitute the light shielding structure.

FIG. 6 shows the light shielding structure formed on the pixel unit according to the first embodiment. FIG. 6A is a plan view showing the structure of various wirings formed on the 4 pixel sharing unit. FIG. 6B is a cross-sectional view of the wiring structure shown in FIG. 6A taken along the line A-A. Further, the pixel unit of the 4 pixel sharing unit shown in FIG. 6A has the same structure as that shown in FIG. 5. The same parts are denoted by the same reference symbols, and a detailed description thereof will be omitted.

The wirings that form the light shielding structure on the pixel unit includes a transfer wiring and other wirings arranged in parallel to the transfer wiring. In this embodiment, as the wirings disposed in parallel to the transfer wiring, a pulse wiring and a dummy wiring are used. The wirings other than the transfer wiring are not particularly limited, and various wirings provided in the CMOS solid-state image pickup apparatus, dummy wirings, or the like can be used as appropriate.

As shown in FIG. 6A, in the pixel unit, transfer wirings 84 to 87 which are extended in a horizontal direction when viewed from above and arranged in a vertical direction in parallel to each other are arranged at necessary intervals. For example, out of the four transfer wirings 84 to 87, at least one transfer wiring is disposed across the photodiode PD. In this example, transfer wirings 84 and 87 are formed across the vicinity of the center of the photodiodes PD.

The transfer wirings 84 to 87 are connected to the transfer gate electrodes 75 to 78 of the transfer transistors Tr11 to Tr14 of the 4 pixel sharing unit. At this time, it is desirable that the four transfer wirings 84 to 87 have the same wiring width and the same wiring interval.

Further, as shown in FIG. 6A, pulse wirings 88 to 91 are provided so as to be adjacent to the four transfer wirings 84 to 87. In FIGS. 6A and 6B, besides the transfer wirings 84 and 87 provided on the outer side, the pulse wirings 88 and 89 and the pulse wirings 90 and 91 are provided, respectively. The pulse wirings 88 to 91 are arranged so as to be in parallel to the transfer wirings 84 to 87. It is desirable that the pulse wirings 88 to 91 and the transfer wirings 84 to 87 have the same wiring width and the same wiring interval.

As shown in FIG. 6B, in the first embodiment, the wirings including the transfer wirings 84 and 87 and the pulse wirings 88 to 91 are formed in the same wiring layer.

Furthermore, as shown in FIGS. 6A and 6B, in a wiring layer different from the wiring layer in which the transfer wirings 84 and 87 and the pulse wirings 88 to 91 are formed, dummy wirings 92 are formed. As shown in FIGS. 6A and 6B, the dummy wirings 92 are disposed so as to be overlapped with the transfer wirings 84 to 87 and the pulse wirings 88 to 91. The dummy wirings 92 may be electrically floated or may be fixed to a power source voltage and a ground.

In the light shielding structure according to the first embodiment, in the multilayer wiring layer, the transfer wirings 84 to 87 and the pulse wirings 88 to 91 are provided in a lower wiring layer, and the dummy wirings 92 are provided in an upper wiring layer.

Like the wirings 40A and 40B shown in FIGS. 4A and 4B mentioned above, the transfer wirings 84 to 87 and the pulse wirings 88 to 91 in the lower layer and the dummy wirings 92 in the upper layer have the overlap amount 82 larger than the distance 81 between the wirings of the wiring layer.

Further, the opening widths 83 of the transfer wirings 84 to 87 and the pulse wirings 88 to 91 are formed to be uniform. Furthermore, the opening widths 83 of the dummy wirings 92 are formed to have a certain length.

The transfer wirings 84 to 87, the pulse wirings 88 to 91, and the dummy wirings 92 are disposed as described above, with the result that a light shielding structure is formed between the photodiodes PD and the active elements such as a logic circuit disposed to be close to the photodiodes PD. Therefore, it is possible to shield hot carrier light generated in the MOS transistor of the logic circuit or the like by the wiring layer that forms the light shielding structure. In addition, it is also possible to shield light generated when a diode for protection is operated by the wiring layer that forms the light shielding structure. Thus, it is possible to prevent the hot carrier light from entering the photodiodes PD of the pixel unit.

In particular, the transfer wirings 84 to 87 and pulse wirings 88 to 91 and the dummy wirings 92 have the overlap amounts 82 larger than the distances 81 between the wirings, with the result that it is possible to shield diagonally incident hot carrier light due to the influence of the diffraction of light. Therefore, it is possible to provide the light shielding structure capable of further suppressing the hot carrier light that enters the photodiodes PD.

As a result, it is possible to avoid causing the hot carrier light to enter the pixel region and thus provide the solid-state image pickup apparatus the image quality of which is upgraded.

Further, the transfer wirings 84 to 87 and pulse wirings 88 to 91 and the dummy wirings 92 have the opening widths 83 which are uniform, with the result that it is possible to set positional relationship between the wirings to be the same. Therefore, it is possible to equalize the coupling capacitance between the wirings and equalize the potential variation of the transfer gates. As a result, the potential variation of the transfer wirings becomes the same for each transfer gate, which can suppress the variation of the saturation signal amounts of the pixels.

3. Second Embodiment of Solid-State Image Pickup Apparatus

Next, the structure of a solid-state image pickup apparatus according to a second embodiment will be described. In the second embodiment, it is also possible to apply the solid-state image pickup apparatus which is the same as the first embodiment except the structure of wirings that form a light shielding structure. Therefore, in the following, the structure of the wirings that form the light shielding structure will be described.

(Wirings: Structural Example of Light Shielding Structure)

Figures 7A, 7B:
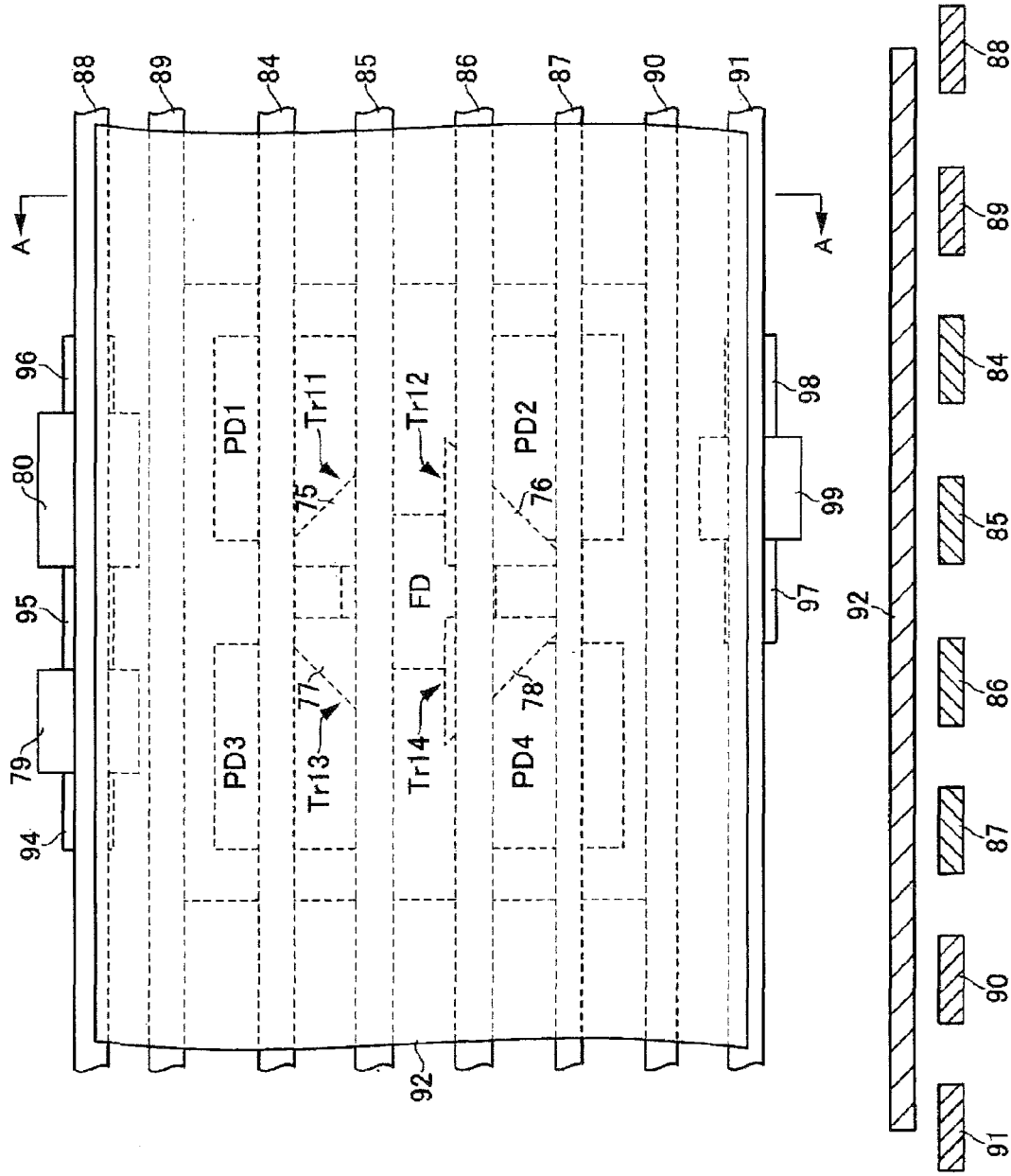
FIG. 7A is a plan view showing the structure of a light shielding structure of a solid-state image pickup apparatus according to a second embodiment.
FIG. 7B is a cross-sectional view of wiring layers that constitute the light shielding structure.

FIGS. 7A and 7B each show a wiring structure that forms the light shielding structure, which is provided on a pixel unit in which a pixel sharing unit is formed. FIG. 7A is a plan view showing the structure of various wirings formed on the 4 pixel sharing unit shown in FIG. 5. FIG. 7B is a cross-sectional view of the wiring structure taken along the line A-A of FIG. 7A.

The transfer wirings 84 to 87 and the pulse wirings 88 to 91 are disposed as in the first embodiment. Above a wiring layer in which the transfer wirings 84 to 87 and the pulse wirings 88 to 91 are formed, a wiring layer in which the dummy wiring 92 is formed is provided.

The dummy wiring 92 covers the photodiodes PD of the 4 pixel sharing unit so as to cover the transfer wirings 84 to 87 and the pulse wirings 88 to 91. It is desirable that a region where the dummy wiring 92 is formed is equal to or larger than the light shielding region shown in FIG. 5. In particular, it is desirable to form the dummy wiring 92 on the entire surface of the pixel unit. The dummy wiring 92 may be electrically floated or may be fixed to a power source voltage or a ground.

Further, the transfer wirings 84 to 87 and the pulse wirings 88 to 91 have the uniform opening widths 83 between the wirings shown in FIGS. 4A and 4B. The dummy wiring 92 entirely covers the transfer wirings 84 to 87 and the pulse wirings 88 to 91, so the overlap amount 82 is uniform for each wiring. Further, the widths of the transfer wirings 84 to 87 and the pulse wirings 88 to 91 are set to be larger than the distance 81 between the wirings, thereby setting the overlap amount 82 to be larger than the distance 81 between the wirings.

The transfer wirings 84 to 87, the pulse wirings 88 to 91, and the dummy wiring 92 are disposed as described above, with the result that it is possible to set positional relationship between wirings to be the same. Therefore, it is possible to equalize the coupling capacitance between the wirings and equalize the potential variations of the transfer gates. Accordingly, the same influence of the potential variations of the transfer wirings is provided, which can suppress the variation of the saturation signal amounts between the photodiodes.

Further, the transfer wirings 84 to 87, the pulse wirings 88 to 91, and the dummy wiring 92 are formed, with the result that the light shielding structure having the overlap amount 82 larger than the distance 81 between the wirings on the pixel unit. Thus, it is possible to prevent the hot carrier light from entering the photodiodes PD of the pixel unit. The structure is particularly effective for the prevention of diagonally incident hot carrier light due to the influence of the diffraction of light.

4. Third Embodiment of Solid-State Image Pickup Apparatus

Next, the structure of a solid-state image pickup apparatus according to a third embodiment will be described. In the third embodiment, it is also possible to apply the solid-state image pickup apparatus as in the first embodiment except the structure of wirings that form a light shielding structure. Therefore, in the following, the structure of the wirings that form the light shielding structure will be described.

(Wirings: Structural Example of Light Shielding Structure)

Figures 8A, 8B:
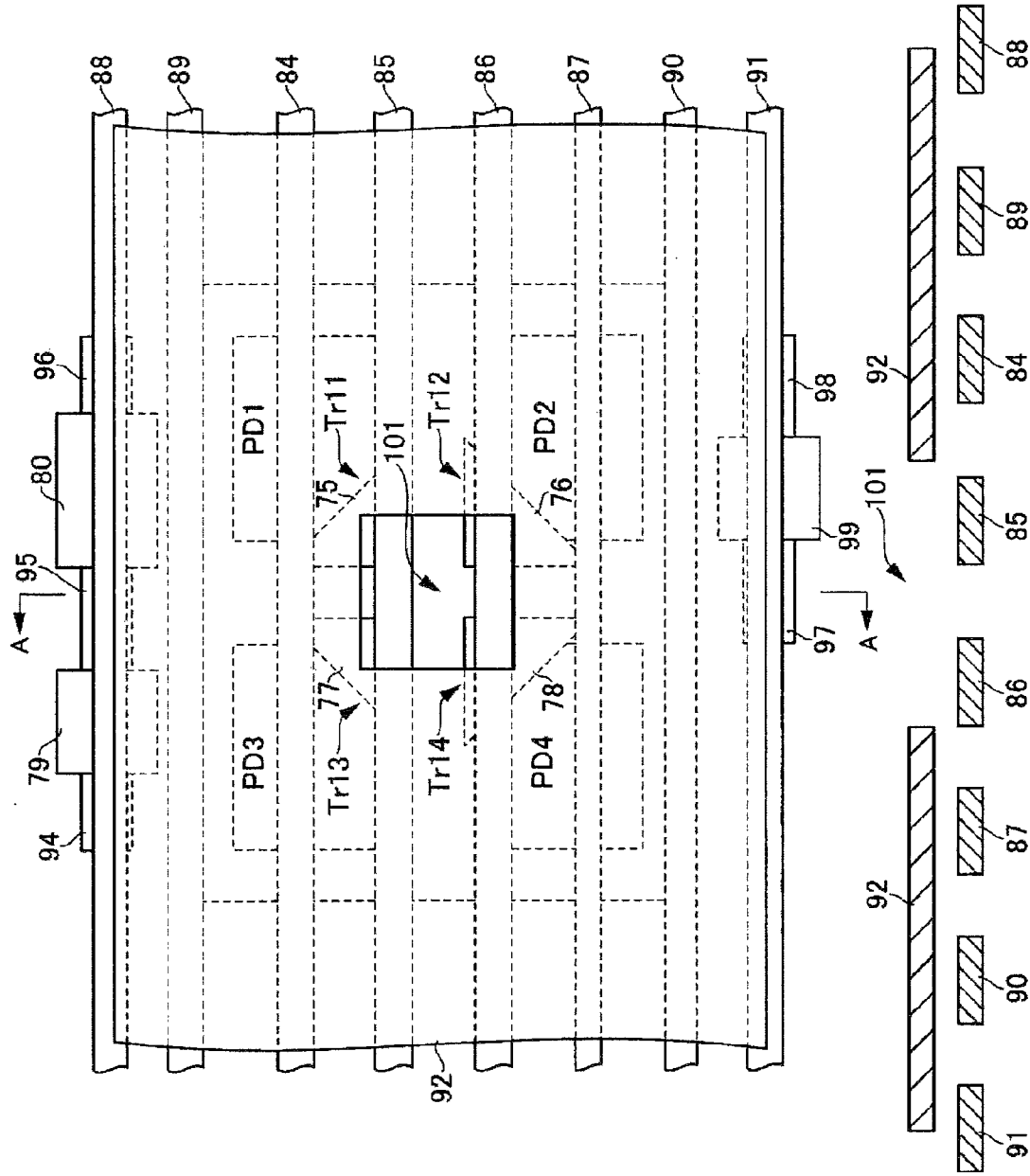
FIG. 8A is a plan view showing the structure of a light shielding structure of a solid-state image pickup apparatus according to a third embodiment.
FIG. 8B is a cross-sectional view of wiring layers that constitute the light shielding structure.

FIGS. 8A and 8B each show a wiring structure that forms the light shielding structure, which is provided on the pixel unit in which the pixel sharing unit is formed. FIG. 8A is a plan view showing the structure of various wirings formed on the 4 pixel sharing unit shown in FIG. 5 mentioned above. FIG. 8B is a cross-sectional view of the wiring structure taken along the line A-A of FIG. 8A.

As shown in FIGS. 8A and 8B, the transfer wirings 84 to 87 and the pulse wirings 88 to 91 are disposed in the same way as the first embodiment. Above the wiring layer in which the transfer wirings 84 to 87 and the pulse wirings 88 to 91 are formed, a wiring layer in which the dummy wiring 92 is formed is provided.

The light shielding structure by the wirings according to the third embodiment is an example in which an opening portion is formed on a part of the light shielding structure. Therefore, the structure shown in FIGS. 8A and 8B has the opening portion on the pixel unit and outside the light shielding region of the photodiodes PD in addition to the light shielding structure according to the second embodiment.

In this way, in the light shielding structure by the wirings, the opening portion may be formed on the pixel unit.

The dummy wiring 92 covers the photodiodes PD of the 4 pixel sharing unit so as to cover the transfer wirings 84 to 87 and the pulse wirings 88 to 91. It is desirable that a region in which the dummy wiring 92 is formed is equal to or larger than the light shielding region shown in FIG. 5. In particular, it is desirable to form the dummy wiring 92 over the entire pixel unit. The dummy wiring 92 may be electrically floated or may be fixed to a power source voltage and a ground.

Further, in the dummy wiring 92, an opening portion 101 from which a part of the wiring is removed is formed. In the light shielding structure by the wirings, a region where an upper wiring layer and a lower wiring layer do not have an overlap corresponds to the opening portion 101. That is, in the example of the third embodiment, a region where the transfer wirings 84 to 87 and the pulse wirings 88 to 91 that are formed in the lower wiring layer and the dummy wiring 92 is not formed in the upper wiring layer corresponds to the opening portion 101 of the light shielding structure by the wirings.

It is difficult to partially remove the transfer wirings 84 to 87 and the pulse wirings 88 to 91, so a part of the dummy wiring 92 is removed, thereby forming the opening portion 101.

It is desirable to form the opening portion 101 on a position excluding the photodiodes PD of the pixel unit in order to shield the hot carrier light generated in the MOS transistor disposed nearby. But, if an opening that does not affect an obtaining image of the solid-state image pickup apparatus, for example, such an opening that only hot carrier light of a detection limit or less is incident on the photodiodes PD is formed, the opening portion 101 may be provided on the photodiodes PD.

For example, on the photodiodes PD shown in FIG. 5, a square region that has at least a side corresponding to a short side of the photodiode PD is the light shielding region 100.

Further, for example, a position where the opening portion 101 is formed and the number of opening portions 101 to be formed are not limited, as long as the center of the opening is not on the photodiode PD.

The transfer wirings 84 to 87 and the pulse wirings 88 to 91 have such positional relationship that the opening widths 83 between wirings shown in FIGS. 4A and 4B are uniform. As long as the disposition of the transfer wirings 84 to 87 and the pulse wirings 88 to 91 has uniformity, uniformity with the dummy wiring does not matter. In the region where the opening portion 101 is formed, the positional relationship between the transfer wirings and the dummy wiring does not keep the uniformity with other region, but the uniformity between the transfer wirings and the dummy wiring has almost no influence on the coupling capacitance and thus may be negligible.

As described above, the transfer wirings 84 to 87 and the pulse wirings 88 to 91 are disposed, thereby making it possible to set the positional relationship between the wirings to be the same. Therefore, it is possible to equalize the coupling capacitance between the wirings and equalize the potential variations of the transfer gates. Therefore, influences of the potential variations of the transfer wirings become the same for each transfer gate, so it is possible to suppress a variation of the saturation signal amount between the photodiodes.

In addition, the dummy wiring 92 that covers the transfer wirings 84 to 87 and the pulse wirings 88 to 91 is formed, thereby forming the light shielding structure having the overlap amount 82 larger than the distance 81 between the wirings on the pixel unit. As a result, it is possible to prevent the hot carrier light from entering the photodiode PD of the pixel unit. The structure is particularly effective for the prevention of diagonally incident hot carrier light due to the influence of the diffraction of light.

It should be noted that also in the first embodiment described above, a part of the dummy wiring 92 is removed, and the region where the dummy wiring 92 in the upper layer and the transfer wirings 84 to 87 and the pulse wirings 88 to 91 in the lower layer do not overlap with each other is provided, with the result that it is possible to provide an opening portion at any position.

5. Fourth Embodiment of Solid-State Image Pickup Apparatus

Next, the structure of a solid-state image pickup apparatus according to a fourth embodiment will be described. In the fourth embodiment, it is also possible to apply the solid-state image pickup apparatus as in the first embodiment except the structure of wirings that form a light shielding structure. Therefore, in the following, the structure of the wirings that form the light shielding structure will be described.

(Wirings: Structural Example of Light Shielding Structure)

Figures 9A, 9B:
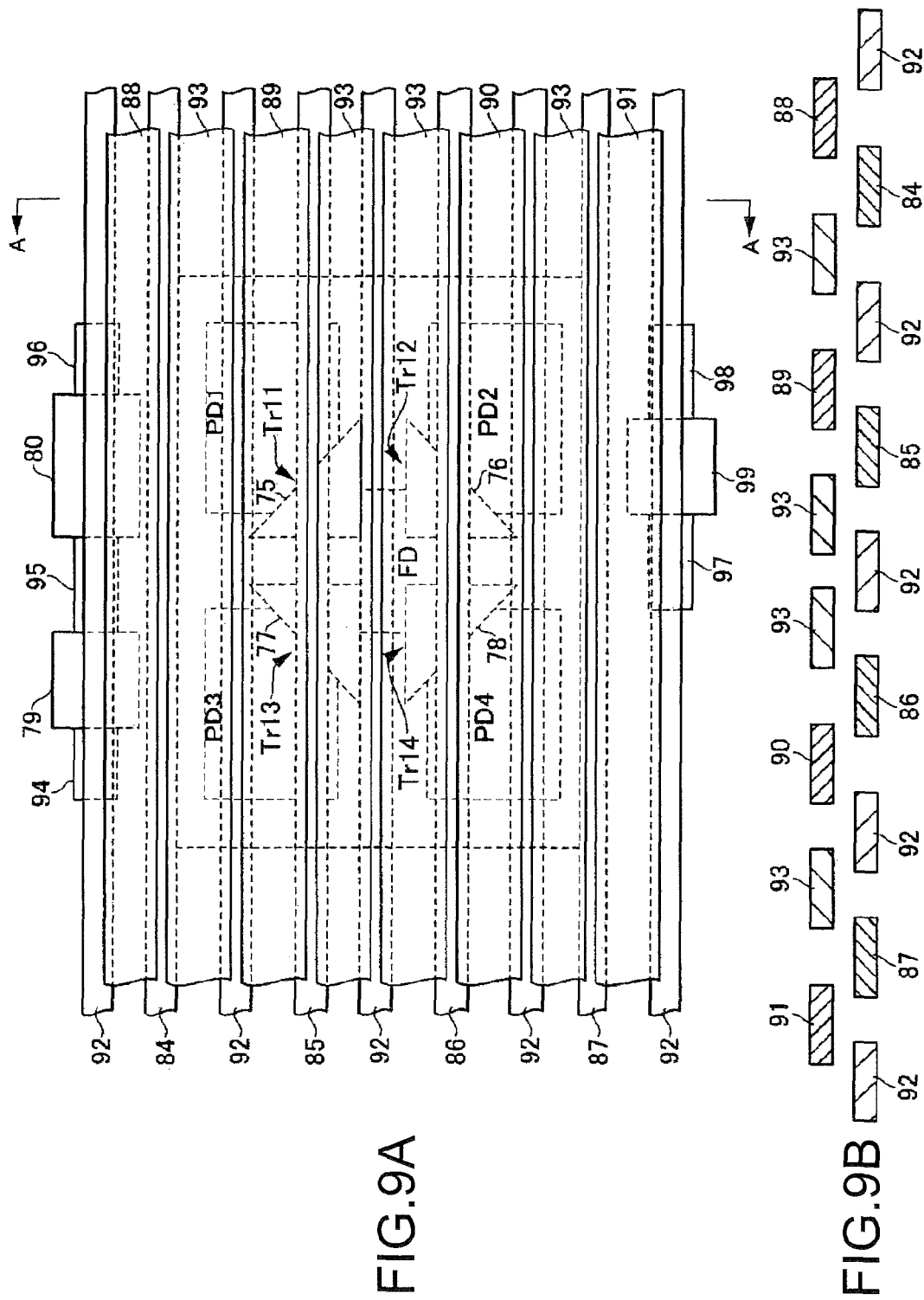
FIG. 9A is a plan view showing the structure of a light shielding structure of a solid-state image pickup apparatus according to a fourth embodiment.
FIG. 9B is a cross-sectional view of wiring layers that constitute the light shielding structure.

FIGS. 9A and 9B each show a wiring structure that forms the light shielding structure, which is provided on the pixel unit in which the pixel sharing unit is formed. FIG. 9A is a plan view showing the structure of various wirings formed on the 4 pixel sharing unit shown in FIG. 5 mentioned above. FIG. 9B is a cross-sectional view of the wiring structure taken along the line A-A of FIG. 9A.

In a lower wiring layer, the transfer wirings 84 to 87 and the dummy wirings 92 are formed. Further, in an upper wiring layer, the pulse wirings 88 to 91 and dummy wirings 93 are formed.

In the lower wiring layer, the transfer wirings 84 to 87 and the dummy wirings 92 that are extended in a horizontal direction when viewed from above and arranged in a vertical direction in parallel to each other are disposed alternately at desired intervals.

In the upper wiring layer, the pulse wirings 88 to 91 and the dummy wirings 93 that are extended in the horizontal direction when viewed from above and arranged in the vertical direction in parallel to each other are disposed alternately at desired intervals.

The transfer wirings 84 to 87 and dummy wirings 93 and the transfer wirings 84 to 87 and pulse wirings 88 to 91 respectively have the overlap amounts 82 larger than the distance 81 between the wirings of the wiring layers like the wirings 40A and 40B shown in FIG. 4. In the same way, the dummy wirings 92 and pulse wirings 88 to 91 and the dummy wirings 92 and dummy wirings 93 respectively have the overlap amounts 82 larger than the distance 81 between the wirings of the wiring layers like the wirings 40A and 40B shown in FIG. 4. In this way, in the upper and lower wiring layers, the overlap amounts 82 of the wirings are each set to be a certain length.

Further, the opening widths 83 between the transfer wirings 84 to 87 and the dummy wirings 92 and the opening widths 83 between the pulse wirings 88 to 91 and the dummy wirings 93 are each set to be a certain length. Furthermore, the intervals between the transfer wirings 84 to 87 in the lower layer and the pulse wirings 88 to 91 in the upper layer are set to be constant.

By arranging the transfer wirings 84 to 87, the pulse wirings 88 to 91, and the dummy wirings 92 and 93 as described above, it is possible to set the positional relationship between wirings to be the same. Therefore, it is possible to equalize the coupling capacitance between the wirings and equalize the potential variations of the transfer gates. As a result, the influence of the potential variations of the transfer wirings become the same for each transfer gate, which can suppress a variation of the saturation signal amount between the photodiodes.

In addition, by forming the transfer wirings 84 to 87, the pulse wirings 88 to 91, and the dummy wirings 92 and 93, the light shielding structure having the overlap amount 82 larger than the distance 81 of the wirings on the pixel unit. Thus, it is possible to prevent the hot carrier light from entering the photodiodes PD of the pixel unit. The structure is particularly effective for the prevention of diagonally incident hot carrier light due to the influence of the diffraction of light.

As described above, in the two wiring layers which constitute the light shielding structure, the transfer wirings 84 to 87 and the pulse wirings 88 to 91 may be formed in different wiring layers. The light shielding structure in which the transfer wirings 84 to 87 and the pulse wirings 88 to 91 are overlapped with each other may be formed. Further, the dummy wirings may be formed in both the wiring layers. By causing the dummy wirings in the upper and lower layers to be overlapped with each other, the light shielding structure may be formed.

In this way, it is also possible to form the light shielding structure by the wirings in addition to the light shielding structure with the overlaps of the transfer wirings 84 to 87, the pulse wirings 88 to 91 with the dummy wirings 92 as in the first to third embodiments.

6. Electronic Apparatus

Next, a description will be given on an electronic apparatus provided with the solid-state image pickup apparatus described above.

Figure 10:
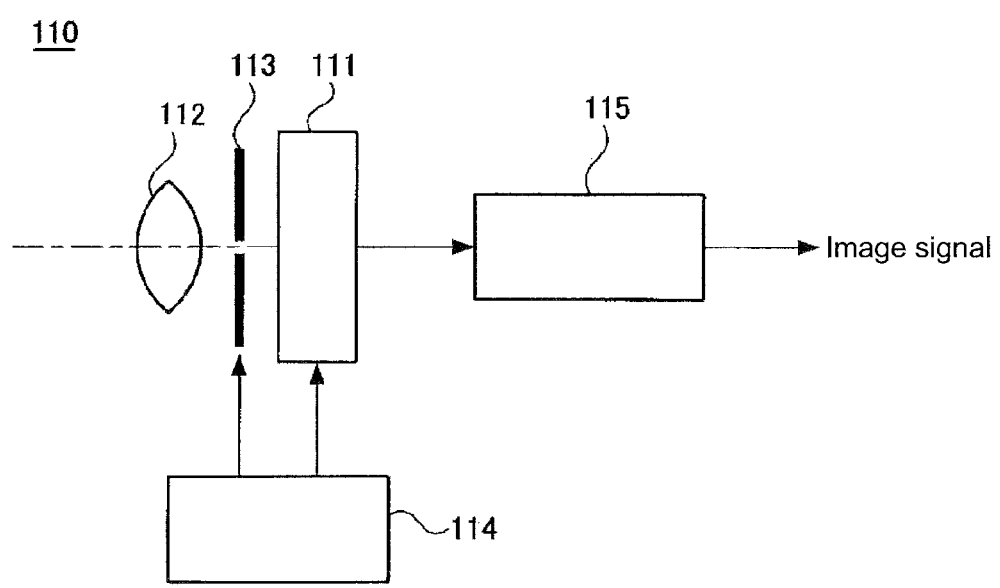
FIG. 10 is a diagram showing the structure of an electronic apparatus.

The solid-state image pickup apparatus is applicable to a camera system such as a digital camera and a video camera, a cellular phone having an image pickup function, or an electronic apparatus such as another apparatus equipped with an image pickup function. In FIG. 10, as an example of an electronic apparatus, a schematic structure in the case where the solid-state image pickup apparatus is applied to a camera capable of taking a still image or a moving image will be shown.

A camera 110 in this example is provided with a solid-state image pickup apparatus 111, an optical system 112 that guides incident light to a light receiving sensor unit of the solid-state image pickup apparatus 111, a shutter apparatus 113 provided between the solid-state image pickup apparatus 111 and the optical system 112, and a drive circuit 114 that drives the solid-state image pickup apparatus 111. Further, the camera 110 is provided with a signal processing circuit 115 that processes an output signal of the solid-state image pickup apparatus 111.

To the solid-state image pickup apparatus 111, the solid-state image pickup apparatus according to the first to fourth embodiments can be applied. The optical system (optical lens) 112 forms image light (incident light) from a subject on an image pickup surface (not shown) of the solid-state image pickup apparatus 111. As a result, in the solid-state image pickup apparatus 111, signal charges are accumulated for a certain time period. It should be noted that the optical system 112 may be constituted of an optical lens group including a plurality of optical lenses. Further, the shutter apparatus 113 controls a light irradiation time period and a light shielding time period of incident light with respect to the solid-state image pickup apparatus 111.

The drive circuit 114 supplies a drive signal to the solid-state image pickup apparatus 111 and the shutter apparatus 113. Then, the drive circuit 114 controls a signal output operation of the solid-state image pickup apparatus 111 to the signal processing circuit 115 and a shutter operation of the shutter apparatus 113 with the drive signal supplied. That is, in this example, with the drive signal (timing signal) supplied from the drive circuit 114, a signal transfer operation from the solid-state image pickup apparatus 111 to the signal processing circuit 115 is performed.

The signal processing circuit 115 performs various signal processes for a signal transferred from the solid-state image pickup apparatus 111. The signal (image signal) that is subjected to the various signal processes is stored in a storage medium (not shown) such as a memory or output to a monitor (not shown).

By the electronic apparatus such as the camera 110, in the solid-state image pickup apparatus 111, it is possible to suppress a variation of a saturation signal amount along with the miniaturization of a pixel size. In addition, in the solid-state image pickup apparatus, it is also possible to suppress light such as hot carrier light from an active element such a diode and a MOS transistor at a time of an operation in a peripheral circuit unit from entering the photodiode. As a result, it is possible to provide a high-quality electronic apparatus the image quality of which is upgraded.

It should be noted that in the above embodiments, the example in which the light shielding structure is constituted of the two wiring layers is given, but the number of wiring layers used for the light shielding structure may be three or more. In this case, it is also possible to form the light shielding structure by increasing the overlap amount of the wirings as compared to the distance between the wirings of the wiring layers. Further, in the case where the light shielding structure is constituted of three or more layers, if the wiring width and the wiring interval are set to be uniform between thee transfer wirings and the other wirings that constitute the light shielding structure, it is also possible to equalize the coupling capacitance.

In addition, in the above embodiments, the case where the pixel region and the control circuit and logic circuit are separately manufactured on the substrates, and the substrates of those are bonded are described. However, the pixel region, the control circuit, and logic circuit may be formed in the same substrate. Further, the pixel region, the control circuit, and the logic circuit may not be provided in a vertical direction and may be provided in the same plane. The present disclosure can be applied to the case where the pixel region, the control circuit, and the logic circuit are disposed close to each other.

It should be noted that the present disclosure can take the following configurations.

(1) A solid-state image pickup apparatus, including:
a pixel region in which a plurality of pixels each including a photoelectric conversion element are arranged;
transfer wirings formed on the pixel region in parallel to each other with uniform opening widths; and
different wirings formed in a wiring layer above the transfer wirings, at least a part of the different wirings being overlapped with the transfer wirings on a plan position, the transfer wirings and the different wirings forming a light shielding structure in the pixel region.

(2) The solid-state image pickup apparatus according to Item (1), in which
the photoelectric conversion element is provided on a first surface of a substrate, and the wiring layer is provided on a second surface of the substrate.

(3) The solid-state image pickup apparatus according to Item (2), further including
a second substrate bonded to the second surface side of the substrate through the wiring layer, in which
the second substrate includes a peripheral circuit unit, and
the light shielding structure is formed between the pixel region and the peripheral circuit unit.

(4) The solid-state image pickup apparatus according to any one of Items (1) to (3), further including
an active element configured to perform signal processing and provided close to the photoelectric conversion element.

(5) The solid-state image pickup apparatus according to Item (4), in which
the active element includes at least one of a field-effect transistor and a diode.

(6) The solid-state image pickup apparatus according to any one of Items (1) to (5), in which
the different wirings include a pulse wiring and a dummy wiring.

(7) An electronic apparatus, including:
the solid-state image pickup apparatus according to any one of Items (1) to (6); and
a signal processing circuit configured to process an output signal of the solid-state image pickup apparatus.

The present disclosure contains subject matter related to that disclosed in Japanese Priority Patent Application JP 2012-051427 filed in the Japan Patent Office on Mar. 8, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. An imaging device, comprising:
a first semiconductor chip unit including
a plurality of photoelectric conversion elements,
a first wiring layer having a first wiring, and
a second wiring layer having a second wiring coupled to a transfer gate associated with a respective photoelectric conversion element, and further having a third wiring that is a dummy wiring; and
a second semiconductor chip unit including a logic circuit, wherein the first semiconductor chip unit is bonded to the second semiconductor chip unit,
the second wiring is adjacent the third wiring with a gap therebetween, such that the gap overlaps a portion of the respective photoelectric conversion element, in a plan view, and
the first wiring includes a first portion that overlaps a portion of the second wiring and a second portion that overlaps the gap, in the plan view.

2. The imaging device according to claim 1, wherein the first semiconductor chip unit is electrically connected to the second semiconductor chip unit via a connection hole.

3. The imaging device according to claim 2, wherein the connection hole includes a connected conductor.

4. The imaging device according to claim 2, wherein the connection hole is covered with an insulating layer.

5. The imaging device according to claim 1, wherein the first semiconductor chip unit is bonded to the second semiconductor chip unit with an adhesive layer.

6. The imaging device according to claim 1, further comprising a stress correction film disposed between the first semiconductor chip unit and the second semiconductor chip unit.

7. The imaging device according to claim 1, wherein the first semiconductor chip unit is bonded to the second semiconductor chip unit by plasma bonding.

8. The imaging device according to claim 1, further comprising a color filter, an on-chip micro lens, and a flattening film.

9. The imaging device according to claim 1, wherein
the first semiconductor chip unit includes a plurality of pixel transistors, and
the first wiring is electrically connected to at least one of the plurality of pixel transistors.

10. The imaging device according to claim 9, wherein the plurality of pixel transistors includes:
a transfer transistor associated with the photoelectric conversion element and/or a floating diffusion,
a reset transistor disposed to allow charges to be selectively discharged from the floating diffusion to a circuit node, and
an amplification transistor coupled to the floating diffusion and configured to allow a signal corresponding to a potential of the floating diffusion to be output to a signal line.

11. The imaging device according to claim 10, wherein the plurality of pixel transistors includes a selection transistor configured to selectively enable an operation of the amplification transistor.

12. The imaging device according to claim 11, wherein the plurality of photoelectric conversion elements share the reset transistor, the amplification transistor, the selection transistor, and the floating diffusion.

13. The imaging device according to claim 10, further comprising a column circuit connected to the signal line, wherein the column circuit is configured to perform a correlated double sampling and an analog-to-digital conversion.

14. The imaging device according to claim 1, wherein the first, second, and third wirings are copper wirings.

15. An electronic apparatus, comprising:
an imaging device comprising
a first semiconductor chip unit including
a plurality of photoelectric conversion elements,
a first wiring layer having a first wiring, and
a second wiring layer having a second wiring coupled to a transfer gate associated with a respective photoelectric conversion element, and further having a third wiring that is a dummy wiring, and
a second semiconductor chip unit including a logic circuit; and
a signal processing circuit configured to process a pixel signal generated by the imaging device, wherein
the first semiconductor chip unit is bonded to the second semiconductor chip unit,
the second wiring is adjacent the third wiring with a gap therebetween, such that the gap overlaps a portion of the respective photoelectric conversion element, and
the first wiring includes a first portion that overlaps a portion of the second wiring and a second portion that overlaps the gap, in the plan view.

16. The electronic apparatus according to claim 15, wherein the first semiconductor chip unit is electrically connected to the second semiconductor chip unit via a connection hole.

17. The electronic apparatus according to claim 16, wherein the connection hole includes a connected conductor.

18. The electronic apparatus according to claim 17, wherein the connection hole is covered with an insulating layer.

19. The electronic apparatus according to claim 16, wherein the first semiconductor chip unit is bonded to the second semiconductor chip unit with an adhesive layer.

20. The electronic apparatus according to claim 16, further comprising a stress correction film disposed between the first semiconductor chip unit and the second semiconductor chip unit.

21. The electronic apparatus according to claim 16, wherein the first semiconductor chip unit is bonded to the second semiconductor chip unit by plasma bonding.

22. The electronic apparatus according to claim 16, further comprising a color filter, an on-chip micro lens, and a flattening film.

23. The electronic apparatus according to claim 16, wherein
the first semiconductor chip unit includes a plurality of pixel transistors, and
the first wiring is electrically connected to at least one of the plurality of pixel transistors.

24. The electronic apparatus according to claim 23, wherein the plurality of pixel transistors includes:
a transfer transistor associated with the photoelectric conversion element and/or a floating diffusion,
a reset transistor disposed to allow charges to be selectively discharged from the floating diffusion to a circuit node, and
an amplification transistor coupled to the floating diffusion and configured to allow a signal corresponding to a potential of the floating diffusion to be output to a signal line.

25. The electronic apparatus according to claim 24, wherein the plurality of pixel transistors includes a selection transistor configured to selectively enable an operation of the amplification transistor.

26. The electronic apparatus according to claim 25, wherein the plurality of photoelectric conversion elements share the reset transistor, the amplification transistor, the selection transistor, and the floating diffusion.

27. The electronic apparatus according to claim 24, further comprising a column circuit connected to the signal line, wherein the column circuit is configured to perform a correlated double sampling and an analog-to-digital conversion.

28. The electronic apparatus according to claim 16, wherein the first, second, and third wirings are copper wirings.

* * * * *